US009392361B2

(12) United States Patent
Agarwal et al.

(10) Patent No.: US 9,392,361 B2
(45) Date of Patent: Jul. 12, 2016

(54) MICROPHONE ASSEMBLY

(75) Inventors: Rishi C. Agarwal, Bangalore (IN);
Shyam S. Somayajula, Bangalore (IN);
Lionel Cimaz, Pleumeleuc (FR)

(73) Assignee: ST-Ericsson SA, Plan-les-Ouates (CH)

( * ) Notice: Subject to any disclaimer, the term of this patent is extended or adjusted under 35 U.S.C. 154(b) by 1025 days.

(21) Appl. No.: 13/505,599

(22) PCT Filed: Oct. 20, 2010

(86) PCT No.: PCT/EP2010/065816
§ 371 (c)(1),
(2), (4) Date: Jul. 30, 2012

(87) PCT Pub. No.: WO2011/054671
PCT Pub. Date: May 12, 2011

(65) Prior Publication Data
US 2012/0308052 A1    Dec. 6, 2012

(30) Foreign Application Priority Data
Nov. 3, 2009 (EP) ..................................... 09306053

(51) Int. Cl.
H04R 3/00 (2006.01)
H03F 3/187 (2006.01)
H03F 3/45 (2006.01)

(52) U.S. Cl.
CPC .................. *H04R 3/00* (2013.01); *H03F 3/187* (2013.01); *H03F 3/45475* (2013.01); *H03F 3/45928* (2013.01); *H03F 2200/375* (2013.01); *H03F 2203/45101* (2013.01); *H03F 2203/45136* (2013.01); *H03F 2203/45586* (2013.01); *H03F 2203/45588* (2013.01); *H04R 2410/00* (2013.01)

(58) Field of Classification Search
CPC combination set(s) only.
See application file for complete search history.

(56) References Cited

U.S. PATENT DOCUMENTS

| 5,673,327 A * | 9/1997 | Julstrom | H04H 60/04 381/110 |
| 6,266,424 B1 * | 7/2001 | Papadopoulos | H04M 1/6008 381/111 |
| 7,259,627 B1 * | 8/2007 | Dhanasekaran | H03F 3/181 330/259 |
| 2008/0002841 A1 * | 1/2008 | Baker et al. | 381/113 |

(Continued)

FOREIGN PATENT DOCUMENTS

| EP | 1879290 A2 | 1/2008 |
| WO | 2007009483 A1 | 1/2007 |

OTHER PUBLICATIONS

Baker, M.W. et al.; "A Low-Power High-PSRR Current-Mode Microphone Preamplifier", IEEE Journal of Solid-State Circuits, vol. 38, No. 10, Oct. 2003, pp. 1671-1678, XP011101732.

*Primary Examiner* — Duc Nguyen
*Assistant Examiner* — Assad Mohammed
(74) *Attorney, Agent, or Firm* — Coats & Bennett, P.L.L.C.

(57) ABSTRACT

Described herein is a microphone assembly for an electronic device incorporating a microphone. The microphone assembly includes a microphone interface that enables direct coupling of inputs from the microphone to a preamplifier. For the purpose, the microphone interface includes a DC servo loop. The DC servo loop provides a DC path for supplying a DC bias current to the microphone and an AC path to receive the AC output obtained from the microphone. The AC path and the DC path allow separation of the AC output of the microphone from the DC bias current. The microphone interface is implemented using reduced number of IC pin interfaces and external components to achieve compactness of the device.

18 Claims, 7 Drawing Sheets

(56) References Cited

U.S. PATENT DOCUMENTS

| | | | | |
|---|---|---|---|---|
| 2008/0024213 A1* | 1/2008 | Magrath | ............... | H03F 1/305 330/96 |
| 2008/0084236 A1* | 4/2008 | Chung | ............... | H04B 1/30 327/307 |
| 2008/0226100 A1* | 9/2008 | Oddoart | ............... | H03F 1/26 381/120 |
| 2009/0002075 A1* | 1/2009 | Chilakapati | ............... | H03F 3/20 330/297 |
| 2009/0010447 A1* | 1/2009 | Waite | ............... | G10K 11/1788 381/71.6 |
| 2009/0180644 A1* | 7/2009 | Jiang | ............... | H04R 3/00 381/120 |
| 2009/0243755 A1* | 10/2009 | Onodera | ............... | H03F 3/187 333/172 |

* cited by examiner

MICROPHONE ASSEMBLY

BACKGROUND

Mic or microphone are generic terms used to describe transducers that convert acoustic energy into electrical energy, or more precisely sound waves into electrical signals. There are a number of different types of microphones in common use. These microphones employ different operating principles such as electrostatics, electromagnetism, piezoelectric effect, etc., and accordingly vary in terms of the acoustic characteristics they display. Selection of a microphone for a particular application is based on the acoustic characteristics.

Microphones providing high-quality reproduction of sound are desirable in a variety of appliances and applications, for example, in communication devices such as cell-phones and consumer electronics such as voice recorders, hearing aids and video cameras. In addition, applications such as Internet telephony and sound recording techniques as used in the film, television and music industry also require microphones that provide distortion-free audio reproduction, regardless of interference of moderate to high amplitude ambient noise.

High performance microphones and their associated circuitries, together referred to as microphone assemblies, are evolving at a rapid pace to cater to the need for higher-quality audio. This evolution typically involves improving the performance of the microphones while at the same time simplifying their design and fabrication. The advent of Integrated circuit (IC) technology has contributed to the popularity of small-sized consumer appliances, such as cell-phones, and has, thereby, led to the development of more compact microphones assemblies.

Compact microphone assemblies are smaller and have lesser number of components. However, the reduction in the size or the number of components can adversely affect the acoustic characteristics of a microphone assembly. For example, a large dynamic range or a low electromagnetic interference (EMI) sensitivity may be difficult to achieve in a compact microphone assembly. Thus, the need for reduction in size of microphone assemblies contradicts the demand for high-quality audio.

SUMMARY

The subject matter described herein is directed towards a high-quality, compact microphone interface for use in electronic devices such as cell-phones, telephones, laptops, hearing aids, camcorders and so on. This summary is not intended to identify essential features of the claimed subject matter, nor is it intended for use in determining the scope of the claimed subject matter.

The microphone interface described herein enables direct coupling of a microphone with a preamplifier. In one implementation of the present subject matter, the microphone interface includes a DC servo loop. The DC servo loop provides a DC path for supplying a DC bias current to the microphone. Additionally, the DC servo loop includes an AC ground to provide an AC path for the AC output obtained from the microphone. The AC path and the DC path separate the AC output of the microphone from the DC bias current to facilitate further processing of the AC output.

In one embodiment, the microphone interface is implemented as an integrated circuit, engaging reduced number of pin interfaces and external components.

BRIEF DESCRIPTION OF THE DRAWINGS

The detailed description is described with reference to the accompanying figures. In the figures, the left-most digit(s) of a reference number identifies the figure in which the reference number first appears. The same numbers are used throughout the drawings to reference like features and components.

DETAILED DESCRIPTION

The disclosed subject matter relates to a microphone assembly for high-quality, low distortion audio reproduction. In particular, the subject matter relates to a configuration of a microphone assembly to provide a reduction in the count of IC (integrated circuit) pins and the number of external components incorporated therein. Such a microphone assembly may be implemented in a variety of electronic devices, for example, cell-phones, hearing aids, audio-video recorders, laptops and so on. The microphone assembly is configured to be interfaced with the signal processing circuits of such electronic devices.

The microphone assembly of the present subject matter includes a microphone interface that enables a direct coupling or capacitor-less coupling of inputs from a microphone to a preamplifier. The microphone interface further provides for a reduction in the number of external components and eliminates use of large size components that may make a typical microphone interface bulky and difficult to fabricate on an IC.

Figure 1:
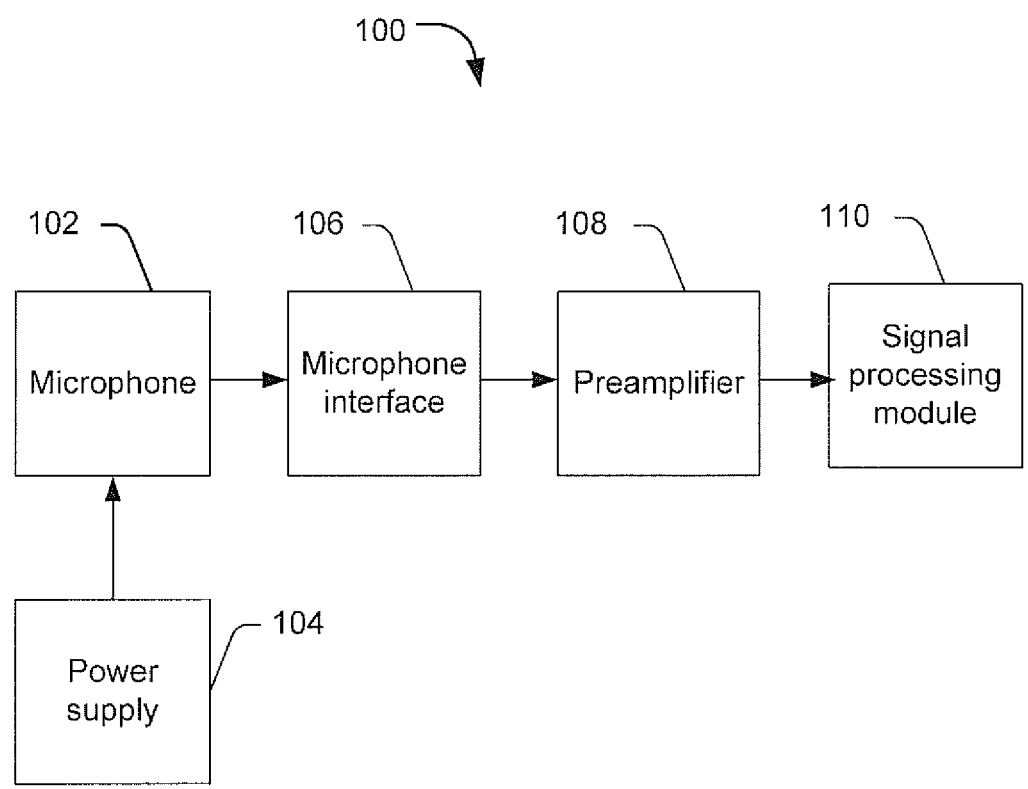
FIG. 1 illustrates a block diagram of a typical microphone assembly.

FIG. 1 illustrates a block diagram of a typical microphone assembly 100 incorporated in an electronic device. The microphone assembly 100 includes an acoustic transducer in the form of a microphone 102 to capture sound wave(s) and detect the varying sound pressure levels of the captured sound waves. Accordingly, the microphone assembly 100 generates an electrical output in accordance with the varying sound pressure levels detected by the microphone 102. The microphone 102 is provided with a bias voltage for generating an electrical output. The bias voltage may be provided by a power supply 104 associated with the microphone 102.

The electrical output generated by the microphone 102 is a mic level signal, and is generally small and practically unfit for any signal processing purposes. The signal processing of the mic level signal is possible once the mic level signal is amplified, say to a line level signal. The amplification of the mic level signal can be performed by a preamplifier 108 included in the microphone assembly 100. Also included in the microphone assembly is a microphone interface 106 that acts as an interface between the microphone 102 and the preamplifier 108. In some implementations, the preamplifier 108 may be in-built within the microphone interface 106.

In operation, the microphone interface 106 receives the mic level signal from the microphone 102 and provides the mic level signal to the preamplifier 108, which amplifies the mic level signal to the line level signal. It is desired that only the mic level signal from the microphone 102 be coupled to the preamplifier 108. For the purpose, the microphone interface 106 may include filtering components to remove noise signals and also decouple the bias voltage that may contribute as noise when received and amplified by the preamplifier 108.

After undergoing amplification at the preamplifier 108, the line level signal is communicated to a signal processing module 110. The signal processing module 110 may facilitate the conversion of the output of the preamplifier 108, i.e., the line level signal from an analog format into a digital format for further utilization in the electronic device such as a laptop or a cellular phone. For example, a digital output from the signal processing module 110 may be recorded onto a disk drive in a digital recording device or may be further processed for transmission over a communication channel.

Figure 2:
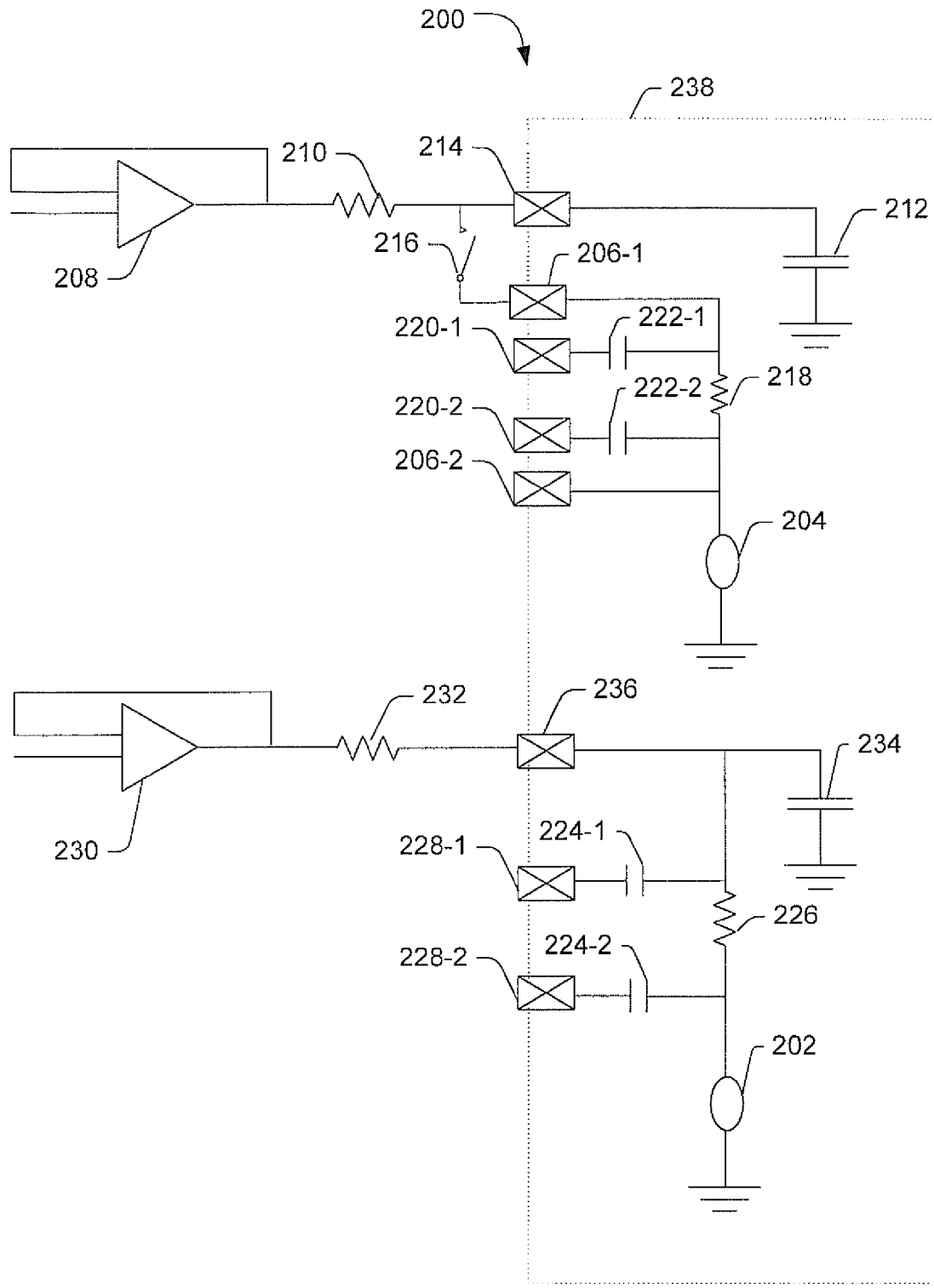
FIG. 2 shows a typical configuration of the microphone assembly for implementation on an integrated circuit (IC).

FIG. 2 shows a typical circuit configuration of a microphone assembly 200 fabricated on an IC. The circuit configuration depicts the various components of the microphone assembly 200 for an electronic device, such as a laptop or a cellular phone. The electronic device may include an internal microphone 202 in-built within the electronic device and an external microphone 204 that may be plugged into the electronic device.

A pair of hook-switch detectors 206-1 and 206-2 detects the insertion of the external microphone 204 into the electronic device and indicates the insertion to a microprocessor (not shown in figure) of the electronic device. On detecting the presence of the external microphone 204 the microprocessor facilitates the connection of a power source to the external microphone 204.

Specifically, the power source provides a bias voltage to the external microphone 204. The bias voltage is supplied by a first micbias amplifier 208, which may be implemented, for example, as a voltage buffer. The first micbias amplifier 208 supplies DC power as bias voltage to the external microphone 204 though a first bias resistor 210. The first micbias amplifier 208 and the first bias resistor 210 are fabricated on the IC and are connected to a first filtering capacitor 212 via a first external micbias pin 214. The first filtering capacitor 212 blocks noise components present in the DC power provided by the first micbias amplifier 208.

Further, the microprocessor operates an on-chip switch 216 to provide the bias voltage to the external microphone 204 through an external mic bias resistor 218. On receiving the bias voltage, the external microphone 204 is activated for use. In usage, the external microphone 204 generates an electrical output, typically in the form of an alternating current (AC) signal. The AC signal results in a corresponding potential difference or AC voltage across the external mic bias resistor 218. Further, the AC voltage is supplied to an on-chip preamplifier (not shown in the figure) through IC pins 220-1 and 220-2, connected across the external mic bias resistor 218.

The on-chip preamplifier reads the AC voltage developed across the external mic bias resistor 218, in the presence of the DC bias voltage supplied by the first micbias amplifier 208. Further, the AC voltage generated by the external microphone 204 is small, such as in the order of a few millivolts, while on other hand the DC bias voltage is much larger, such as in the order of a few hundred millivolts. To enable the on-chip preamplifier to retrieve and amplify only the AC voltage, a first pair of AC coupling capacitors 222-1 and 222-2 are connected across the external mic bias resistor 218 to block the bias voltage.

In order to appropriately block the bias voltage, large size AC coupling capacitors 222-1 and 222-2 are required. The typical values of these capacitors is in the range of about 200 nanoFarad to 1 microFarad. The large size of the AC coupling capacitors 222-1 and 222-2 make them unsuitable for incorporation within the IC. In such a case, the AC coupling capacitors 222-1 and 222-2 are implemented as external components, thereby making the entire microphone assembly 200 bulky.

Similar to the external microphone 204, the internal microphone 202 also generates an electrical output in the form of an AC voltage. The AC voltage from the internal microphone 202 is coupled to the on-chip preamplifier via a second pair of AC coupling capacitors 224-1 and 224-2, connected across an internal mic bias resistor 226 using IC pins 228-1 and 228-2. Similar to the function of the first pair of AC coupling capacitors 222-1 and 222-2, the second pair of AC coupling capacitors 224-1 and 224-2 also decouple the bias voltage supplied to the internal microphone 202 through a second micbias amplifier 230. An on-chip second bias resistor 232 and a second filtering capacitor 234 are associated with the second micbias amplifier 230 to serve as noise filtering components. In addition, the second micbias amplifier 230 and the second bias resistor 232 are implemented on the IC and are connected to the second filtering capacitor 234 via a second external micbias pin 236.

Figure 3:
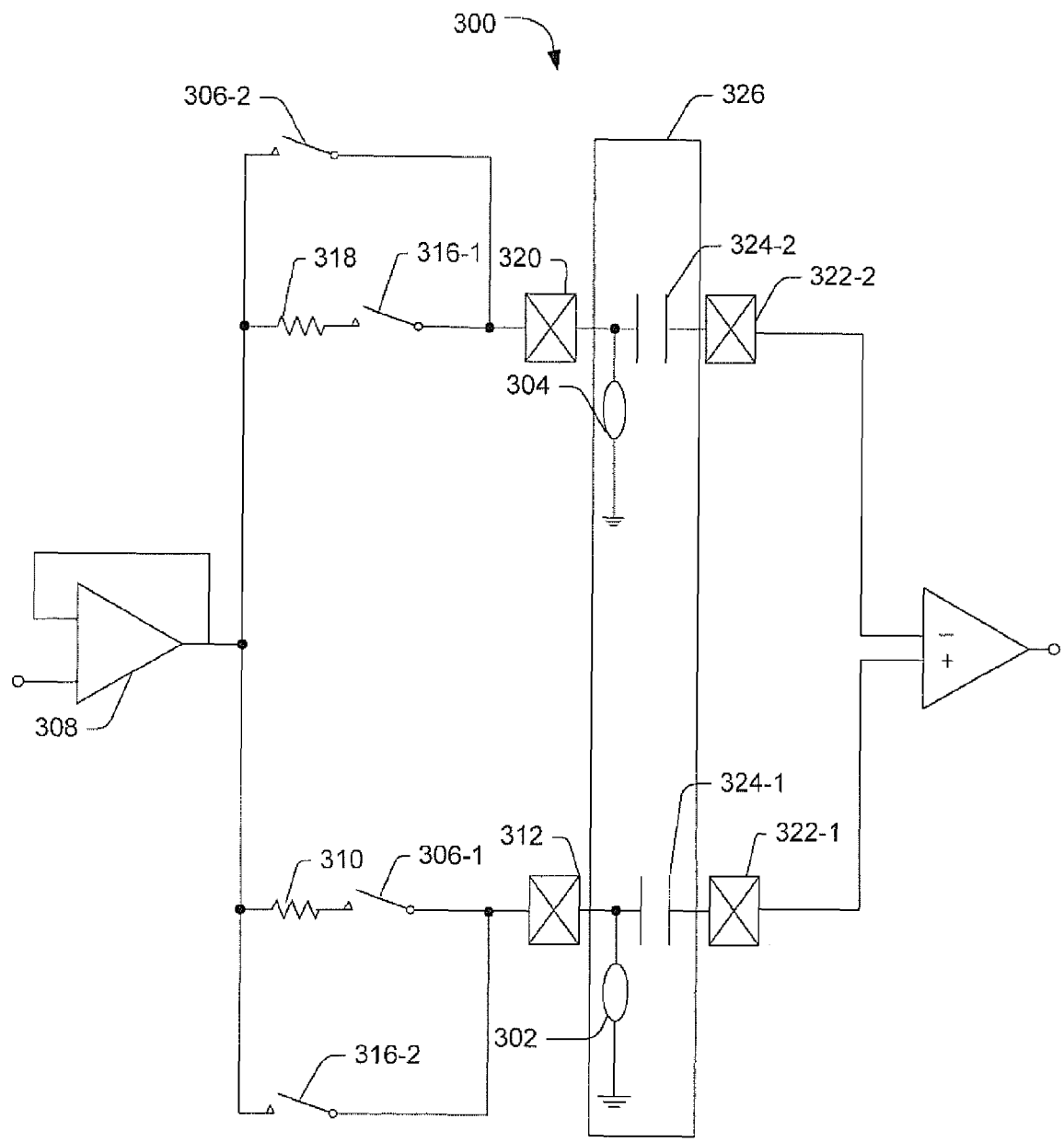
FIG. 3 illustrates another typical configuration of a microphone assembly for achieving a reduction in components and IC pins.

The above described circuit configuration of the microphone assembly 200 includes numerous components. A few components are incorporated on the IC while a significant number of components such as the first and the second pair of AC coupling capacitors 222-1 and 222-2 as well as 224-1 and 224-2 are external to the IC and are interfaced with the components on the IC though IC pins. Specifically, the microphone assembly 200 includes as many as eight external components interfaced to the on-chip components utilizing up to eight IC pins. The external components are depicted to be enclosed within the dotted enclosure 238. Such external components reduce the compactness of the microphone assembly 200, thus making it bulky. Several approaches have been developed for reducing the number of components used in microphone assemblies and also reducing the number of IC pins FIG. 3 illustrates a typical configuration of a microphone assembly 300 fabricated in an IC for attaining reduction in the number of external components and IC pins. The configuration of the microphone assembly 300 enables the implementation of both an internal microphone 302 as well as an external microphone 304 in an electronic device.

To activate the internal microphone 302, a microprocessor (not shown in FIG. 3) of the electronic device closes an internal mic path by closing a first pair of switches 306-1 and 306-2 to connect an on-chip voltage source 308 to the internal microphone 302. The on-chip voltage source 308 supplies a DC bias voltage to the internal microphone 302 through a first bias resistor 310 incorporated on the IC and through a first bias pin interface 312. The DC bias voltage activates the internal microphone 302 to generate an electrical output. The electrical output from the internal microphone 302 is provided to a preamplifier 314. The preamplifier 314 can be implemented on the IC in the form of a differential amplifier.

Similarly, when the microprocessor detects the insertion of the external microphone 304 into the electronic device, the microprocessor enables a second pair of switches 316-1 and 316-2 to close an external mic path to supply the DC bias voltage from the on-chip voltage source 308 to the external microphone 304. The DC bias voltage is supplied through a second bias resistor 318, which may be incorporated within the IC. A second bias pin interface 320 is used to couple the second bias resistor 318 to the external microphone 304.

A first mic input pin 322-1 and a second mic input pin 322-2 are engaged to couple the output of the internal microphone 302 and the external microphone 304, respectively, to the preamplifier 314. The electrical output of the microphones 302 and 304 is a feeble AC current that needs to be separated from the comparatively larger DC current produced due the bias voltage which is DC in nature. For the purpose, the output of the microphones 302 and 304 is coupled to the preamplifier 314 via a pair of DC blocking capacitors 324-1 and 324-2. The DC blocking capacitors 324-1 and 324-2 are large sized capacitors, typically placed external to the IC. The dotted enclosure 326 depicted in the figure, encloses the external components.

The electrical output from the internal microphone 302 is received at the input terminal of the preamplifier 314 connected to the mic input pin 322-1. Similarly, the output from the external microphone 304 is fed to the input terminal of the preamplifier 314 connected to the mic input pin 322-2. In one example, the output from the internal microphone 302 may be connected to a non-inverting input of the preamplifier 314 and the output from the external microphone 304 may be connected to an inverting input of the preamplifier 314.

In a situation where the internal microphone 302 is operable, the electrical output from the internal microphone 302 is sensed at the non-inverting input while the inverting input connected to second mic input pin 322-2 senses the DC bias voltage as well as the potential drop that the electrical output from the internal microphone 302 generates across first bias resistor 310. Likewise, when the external microphone 304 is functional, the preamplifier 314 reads the output of the external microphone 304 at its inverting input, while the non-inverting input, connected the first mic input pin 322-2, reads the DC bias voltage along with the potential drop generated across the second bias resistor 318 due to the external microphone 304.

Thus, as apparent, an audio path for audio frequency signals from the microphones 302 and 304 to the preamplifier 314 is not fully differential at audio frequencies. This restricts faithful amplification of the inputs from the microphones 302 and 304 since the noise coupling from the internal mic path and the external mic path is not completely rejected. Also, the preamplifier 314 fails to discard any unwanted electromagnetic interference (EMI) coupled to the input of the preamplifier 314.

Further, the external mic path is abruptly closed or opened at instances when the external microphone 304 is attached or removed from the electronic device. This may provide a large DC input to the preamplifier 314. This large DC input may saturate the output of the microphone assembly 300 and/or may often result in an undesirable high-amplitude 'pop' sound that may be heard at the output of the electronic device.

As illustrated, the configuration of the microphone assembly 300 provides reduction of components and IC pins only to a small extent by employing four IC pins and two external components, but escalates problems such as noise and EMI.

Figure 4:
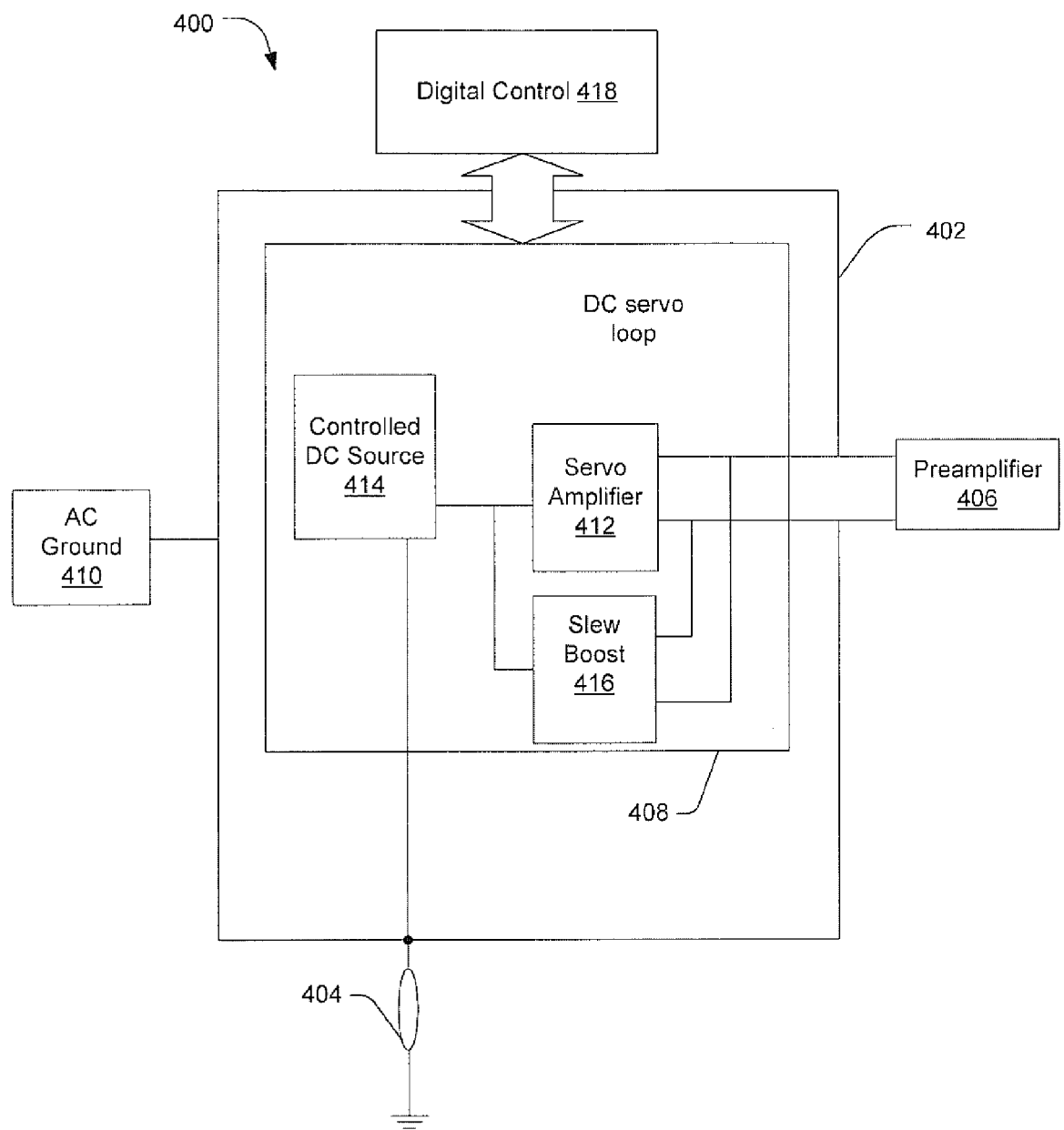
FIG. 4 illustrates a block diagram representation of an exemplary microphone assembly in accordance with an embodiment of the present subject matter.

FIG. 4 illustrates a block diagram representation of an exemplary microphone assembly 400 for high-quality audio reproduction, in accordance with an embodiment of the present subject matter. The microphone assembly 400 includes a microphone interface 402 to couple a microphone 404 with an on-chip preamplifier 406 for providing a distortion-free audio while using reduced number of components. In one embodiment, the microphone interface 402 incorporates a DC servo loop 408. The DC servo loop 408 separates the path of the AC output of the microphone 404 from the path of the DC bias current needed to bias the microphone 404. This provides for segregation of the path of the microphone AC output, which is incapable of being amplified in the presence of a much larger DC bias current. In addition, the DC servo loop 408 eliminates the use of large size capacitors customarily used as DC blocking capacitors for AC coupling of the output of the microphone 404 to the on-chip preamplifier 406. Thus in other words, the microphone interface 402 provides for capacitor-less coupling of the microphone 404. The microphone interface 402 described herein provides for direct coupling or DC coupling of the microphone 404 to the preamplifier 406.

The output of the microphone 404 is a small AC current, which is perceived at the input of the preamplifier 406 as a voltage drop with respect to an AC ground 410, when measured across a sensing resistor (not shown in figure). The DC bias current required to be provided to the microphone 404 is variable and depends on various factors such as the terminal voltages, temperature, and manufacturing conditions. An optimum DC bias current required by the microphone 404 is sensed and accordingly supplied by the DC servo loop 408 to the microphone 404. For the purpose, the DC servo loop 408 includes a servo amplifier 412 and a controlled DC source 414. The servo amplifier 412 determines the bias current requirement of the microphone 404 and accordingly directs the controlled DC source 414 to alter the DC current supplied to the microphone 404. Also, the DC servo loop 408 is configured to maintain a DC potential at the input of the preamplifier 406 such that the DC potential is equal to the DC bias provided to the microphone 404.

In one embodiment, the servo amplifier 412 may be associated with a slew boost module 416. The slew boost module 416 is typically included in the DC servo loop 408 to enhance the response time of the servo amplifier 412. A digital control module 418 associated with the DC servo loop 408 operates the slew boost 416 at instances when faster response is desired from the servo amplifier 412. In addition, the digital control module 418 interacts with the DC servo loop 408 to eliminate any DC bias voltage that may get linked from the microphone interface 402 to the input of the preamplifier 406. The operation of the digital control module 418 to activate the slew boost module 416 and to eliminate the DC bias voltage is elaborated later.

Figure 5:
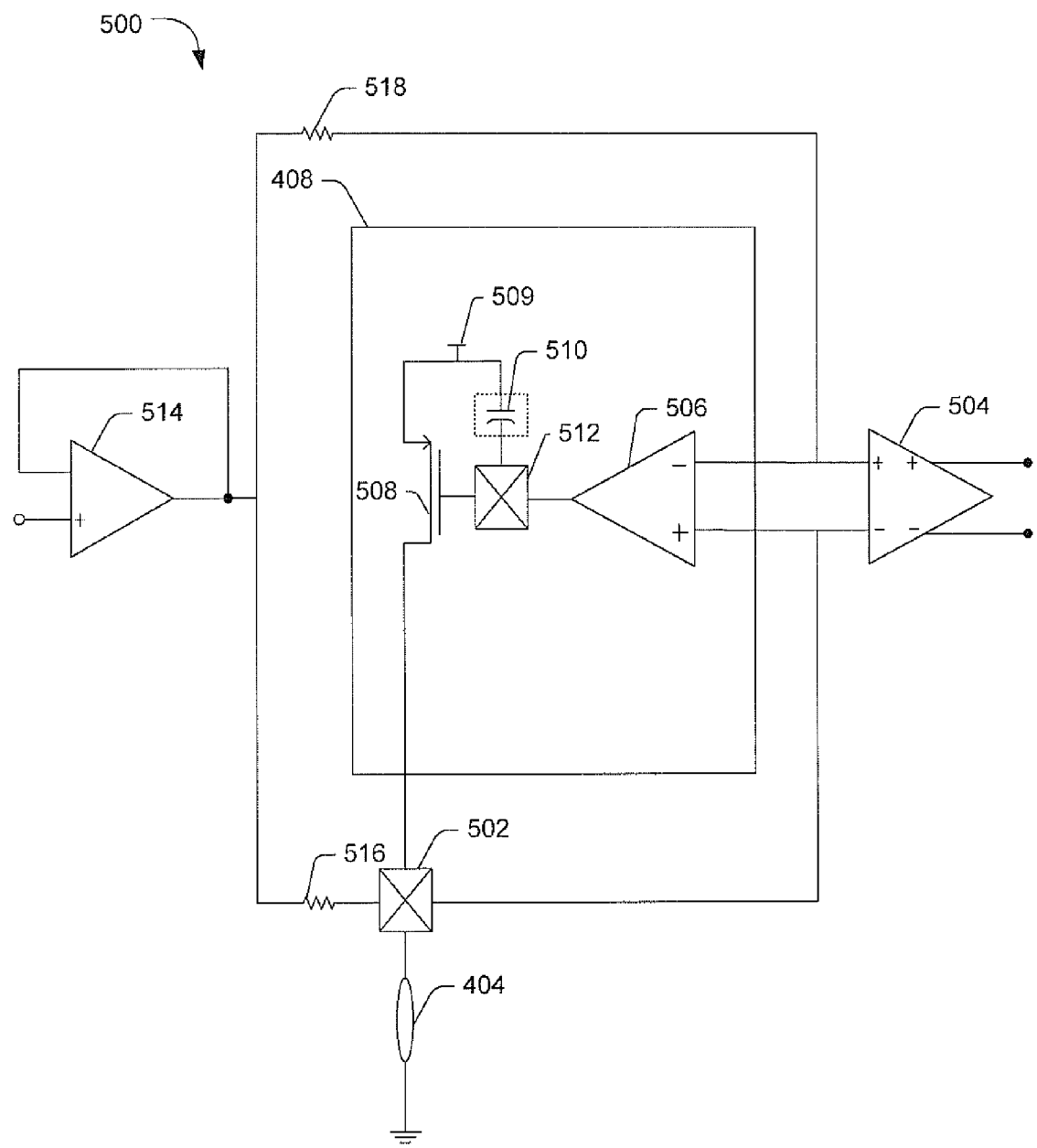
FIG. 5 illustrates an exemplary configuration for the implementation of microphone assembly of FIG. 4 on an IC in accordance with an embodiment of the present subject matter.

FIG. 5 illustrates an exemplary configuration 500 for the implementation of the microphone assembly 400 on an IC, in accordance with an embodiment of the present subject matter. The configuration 500 is described in conjunction with the concepts described with FIG. 4. In one embodiment, the microphone 404 is connected to the DC servo loop 408, incorporated on the IC, using a first interface pin interface 502. The first interface pin interface 502 also couples the microphone 404 to the preamplifier 406. In one implementation, the preamplifier 406 is implemented on the IC as a differential amplifier, termed as preamp opamp 504 hereinafter. The preamp opamp 504 reads the output from the microphone 404.

The DC servo loop 408 interfaced with the preamp opamp 504 senses the signals from the microphone 404 to the preamp opamp 504. The DC servo loop 408, as aforementioned, includes the servo amplifier 412, which may be implemented using an operational amplifier (OPAMP), referred to as a servo opamp 506 hereinafter. The servo opamp 506 senses the signals from the microphone 404 to determine the biasing requirement of the microphone 404 and varies the gate voltage of a field effect transistor (FET) 508 to control the bias current provided to the microphone 404 from a DC bias voltage supply 509. The FET 508 is interfaced with a bandwidth limiting capacitor 510 via a second pin interface 512. In one implementation, the FET 508 and the bandwidth limiting capacitor 510 are included within the controlled DC source 414.

The bandwidth limiting capacitor 510 causes the DC servo loop 408 to provide high impedance to the AC signals from the microphone 404. It should be noted that the frequency of the AC signals from the microphone 404 corresponds to the frequency of audio signals. Hence, AC signals whose frequency corresponds to the frequency of audio signals are restricted from entering the DC servo loop 408, while low frequency signals, mainly associated with the large DC bias current, enter the servo loop and are prevented from being received and amplified by the preamp opamp 504. For example, the bandwidth limiting capacitor 510 may have a capacitance of the order of one microFarad and thus, signals having a frequency below 50 Hz may be disallowed from being amplified.

To eliminate any other noise that may originate from within a component of the microphone interface 402, all connections made between the components and the preamplifier 406 are made to provide a differential signal. For example, the servo amplifier 412 is connected to provide a differential input to the preamp opamp 504 to facilitate rejection of the associated noise. Also, a non-inverting opamp 514 with a feedback loop implemented as the AC ground 410 is connected differentially across the preamp opamp 504. The non-inverting opamp 514 is connected to one end of the preamplifier 406 through a mic bias resistor 516. In order to make the input differential at the other end of the preamp opamp 504, the non-inverting opamp 514 is connected to the other end via a differential resistor 518. The mic bias resistor 516 and the differential resistor 518 have the same resistance. In one example, the resistance is about two kilo-ohms.

The microphone interface 402 provides for cancellation of noise for providing a noise-free audio while at the same time engages less number of components thereby becoming compact. In one implementation, the microphone interface 402, as explained above, is implemented using two IC pin interfaces and one external component. In another implementation, the microphone interface 402 is implemented using three IC pin interfaces and one external component to include an internal microphone as well as an external microphone, as explained below.

Figure 6:
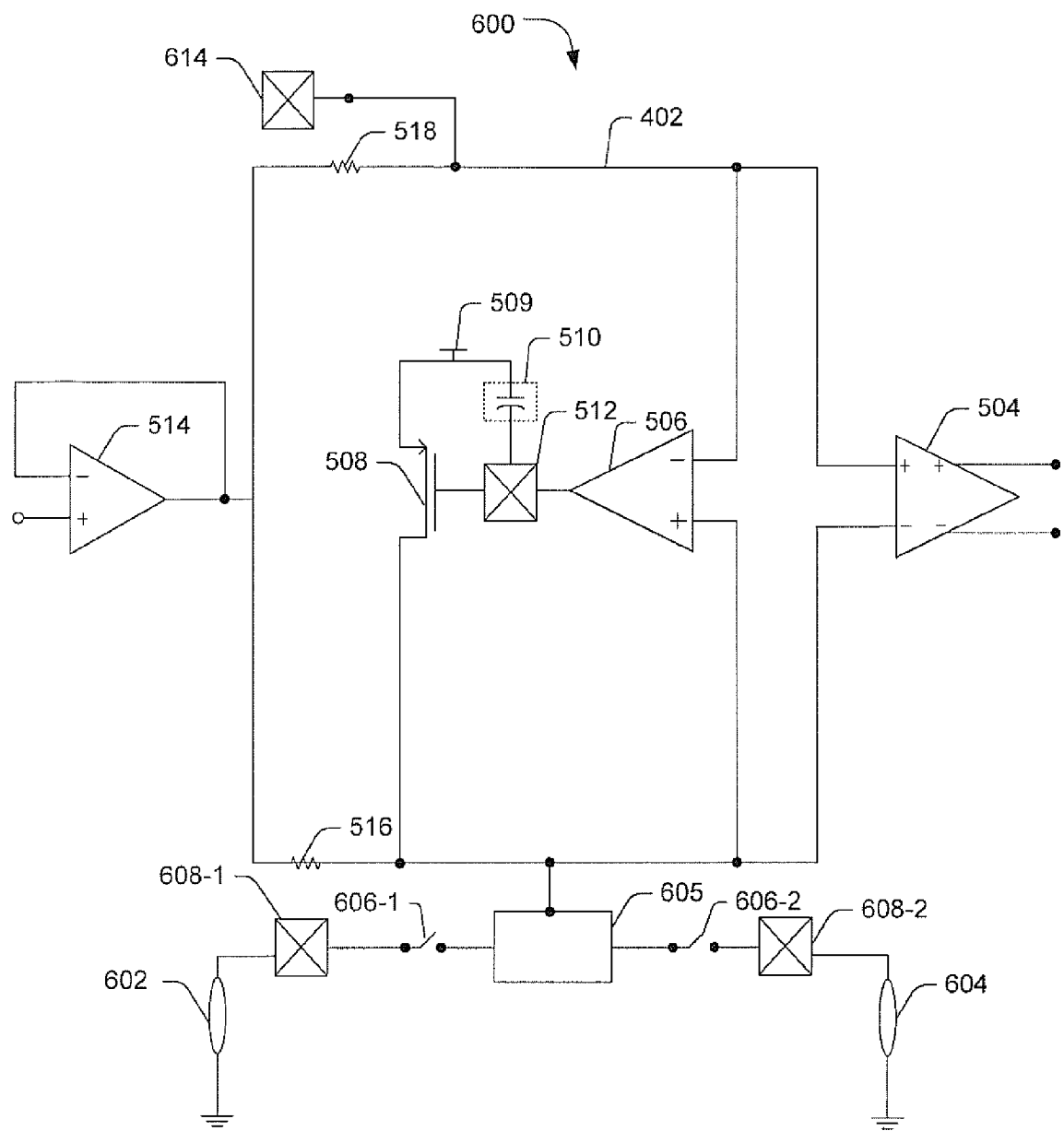
FIG. 6 illustrates an implementation of the microphone interface of FIG. 4 for incorporating an internal microphone and an external microphone in accordance with one embodiment of the invention.

FIG. 6 illustrates an implementation 600 of the microphone interface 402 for incorporating an internal microphone 602 and an external microphone 604 in accordance with one embodiment of the invention. The implementation 600 is described in conjunction with the terms and concepts described in FIGS. 4-5. In the present embodiment, the microphone interface 402 includes a microphone switch 605 implemented to enable switching between the internal microphone 602 and the external microphone 604.

The microphone switch 605 is coupled to an internal mic switch 606-1 and an external mic switch 606-2, which are used to connect the internal microphone 602 and the external microphone 604, respectively, to the microphone interface 402. An internal mic pin interface 608-1 engages the internal microphone 602 to the internal mic switch 606-1 and an external mic pin interface 608-2 engages the external microphone 604 to the external mic switch 606-2. At instances when the external microphone 604 is inserted or removed from the electronic device, the microprocessor (not shown in Fig.) of the electronic device enables the microphone switch 605 to operate the internal mic switch 606-1 or the external mic switch 606-2 to allow activation of either the internal microphone 602 or the external microphone 604.

Typically, pin interfaces of an IC, such as mic pin interfaces 606-1 and 606-2, are metallic and may act as minute antennas to which external EMI may get coupled. The external EMI captured by the mic pin interfaces 606-1 and 606-2 is often converted into a DC signal. This DC signal may get coupled to the preamp opamp 504 and distort the output from the internal microphone 602 or the external microphone 604. To prevent such distortions due to EMI, it is required that the EMI gets cancelled, and thus restricted from getting amplified by the preamp opamp 504.

In one embodiment, an EMI receptor 614 is implemented on the IC. The EMI receptor 614 captures EMI signals as captured by the mic pin interfaces 606-1 and 606-2. The EMI receptor 614 is interfaced with the preamp opamp 504 in such a manner that an EMI input from the EMI receptor 614 is perceived as a differential signal with respect to the EMI signals from the mic pin interfaces 606-1 and 606-2. Consequently, the EMI signals are rejected at the input of the preamp opamp 504. In one implementation, the EMI receptor 614 is an IC pin interface that is not bounded out of the die pad of the IC.

Also, many a times, mismatches may occur in the small sized components, such as the servo opamp 506 and the preamp opamp 504, due to fabrication-related imperfections. Such mismatches typically lead to the generation of an offset voltage, mainly in the form of a DC voltage, at the inputs of the servo opamp 506 and the preamp opamp 504. The offset voltage may be substantially large and may saturate the output of the preamp opamp 504. Also, the offset voltage may reduce the useful dynamic range of the microphone interface 402.

Further, abrupt voltage changes may occur at the output of the preamp opamp 504 when a gain change is applied at the preamp opamp 504. For example, a gain change may occur when the external microphone 604 is plugged in. This abrupt change in the voltage is, in effect, an abrupt change in the DC level at the output of the preamp opamp 504, often heard as a 'pop' sound.

The offset voltage and the 'pop' noise are undesired and are thus required to be eliminated. In one implementation, the digital control module 418 operably coupled to the microphone interface 402 is employed to eliminate the offset voltage and the 'pop' noise.

Figure 7:
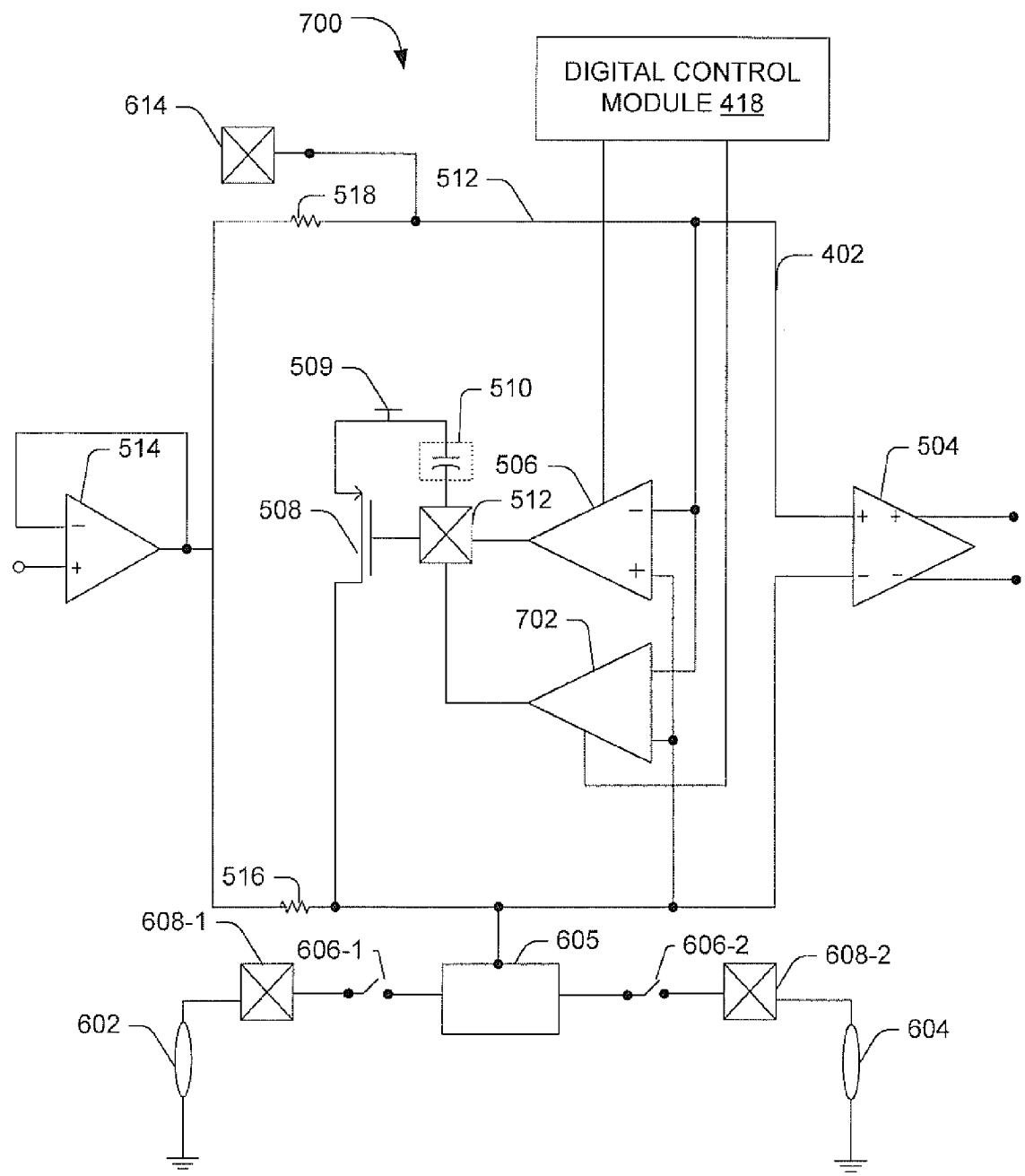
FIG. 7 illustrates a digital control module associated with the microphone interface according to one embodiment of the invention.

FIG. 7 illustrates an implementation 700 of the microphone interface 402 incorporating the digital control module 418 for elimination of the offset voltage and the 'pop' noise, in accordance with one embodiment of the invention. The implementation 700 is described in conjunction with the terms and concepts introduced in FIGS. 4-6.

While switching between the internal microphone 602 and the external microphone 604, the preamp opamp 504 observes a sudden change in its differential input. For example, when the external microphone 604 is inserted into the electronic device, there may be a momentary decrease in voltage causing a voltage drop at the inverting input of the preamp opamp 504 as compared to its non-inverting input. This voltage drop gets amplified by the gain of the preamp opamp 504 and can saturate the output of the preamp opamp 504. It should be noted that this voltage drop gets coupled to the preamp opamp 504 because the DC servo loop 408 may require some response time before the voltage at the non-inverting input may be altered in proportion to the voltage drop that occurred at the inverting input.

In one embodiment, the response time of the DC servo loop 408 is about 600 milliseconds. The response time of the DC servo loop 408 is mainly due to the DC settling time required by the servo opamp 506. To expedite the DC settling time, the slew boost module 416 is operated by the digital control module 418 every time a switching occurs. In one example, the slew boost module 416 may be operated at instances when the microphone switch 605 indicates to the digital control module 418 the insertion or removal of the external microphone 604. When switching occurs, the digital control module 418 activates the slew boost amplifier 702 and interrupts the servo opamp 506.

In one embodiment, the slew boost module 416 is implemented using a slew boost amplifier 702 having a DC settling time of about 20 milliseconds. In one embodiment, during the time period when the slew boost amplifier 702 is operational, the digital control module 418 blocks the output of the preamp opamp 504 from getting further processed. The time duration is in the order of 20 millisecond and is not perceivable at the output of the preamp opamp 504. Blocking of the output of the preamp opamp 504 prevents the 'pop' noise and restricts saturation of any further audio stages at the output of the preamp opamp 504.

The digital control module 418 has an in-built counter mechanism to govern the operation of the slew boost module 416. The counter mechanism determines a time duration of operation of the slew boost amplifier 702. In one example, the time duration of operation of the slew boost amplifier 702 is about 20 milliseconds. The counter mechanism sends pulses for activation and deactivation of the slew boost amplifier 702, thereby facilitating operation of the slew boost amplifier 702 for the predetermined time period.

To eliminate the offset voltage, in one implementation, the digital control module 418 includes a DC calibration unit in-built within the digital control module 418. The DC calibration unit performs offset calibration to remove a DC offset voltage at the output of the microphone interface circuit 402. When the internal microphone 602 and the external microphone 604 are idle, for instance when the internal microphone 602 and the external microphone 604 are not operating or are decoupled from the microphone interface 402, the digital control module 418 automatically senses and calculates a value of the offset voltage present at the output of the microphone interface 402. As explained earlier, the offset voltage is mainly a DC offset voltage occurring due to mismatch of the small sized components such as the servo opamp 506 and the preamp opamp 504 of the microphone interface circuit 402. In one example, the internal microphone 602 and the external microphone 604 may be decoupled using the internal mic switch 606-1 and external mic switch 606-2, respectively. In another example, internal switches may be provided in series with the microphones 602 and 604 to decouple them. It will be appreciated that any switch connected in series with the internal microphone 602 may be used to decouple the internal microphone 602 while a similar switch in series with the external microphone 604 may decouple the external microphone 604.

The digital control module 418 sends digital signals to the servo opamp 506 such that these digital signals correspond to the sensed offset voltage. The sending of the digital signals by the digital control module 418 to the servo opamp 506 corresponds to an operation of sending a DC offset signal with reversed polarity to the microphone interface 402. In effect, the operation of sending the digital signals to the servo opamp 506 is performed by the digital control module 418 so as to cancel or nullify the DC offset signal present at the output of the microphone interface 402.

The sequence of operations performed by the digital control module 418 may be summarized using an example of a cellular phone. The electronic device is referred to as a cellular phone for the purpose of illustration. The examples, in no way, should be construed to be limiting. It will be appreciated that the following description extends to any electronic device having a microphone assembly. Consider an example where a user of the cellular phone initiates a call. A call initiation request is received by the digital control module 418, which, in turn, initiates an interface preparation process for the audio circuitry of the cellular phone. The audio circuitry comprises a microphone assembly such as the microphone assembly 400 that includes the microphone interface 402. It will be appreciated that the interface preparation process may also be initiated in the electronic device at instances such as while plugging in of the external microphone or switching between the internal and the external microphones. The interface preparation process is herein explained with reference to the microphone interface 402 and components thereof.

The interface preparation process begins with determining the biasing requirement of the active microphone. As apparent, the active microphone may be the internal microphone 602 or the external microphone 604 depending on the inputs of the microphone switch 605 provided to the digital control module 418. As aforementioned, the servo opamp 506 determines the biasing requirement of the active microphone. Once the servo opamp 506 has sensed the biasing requirement of the active microphone, the digital control module 418 interrupts the servo opamp 506 and activates the slew boost module 416. As mentioned before, the slew boost module 416 is operated to enhance the response time of the servo opamp 506. For this purpose, the slew boost amplifier 702 is operated in parallel to the servo opamp 506.

The digital control module 418 operates the slew boost module 416 for the time period predetermined by the in-built counter mechanism, and thereafter reactivates the servo opamp 506. On activation, the servo opamp 506 causes the controlled DC source 414 to provide the required bias to the microphone as determined earlier. Thereafter, the microphone is decoupled and the DC calibration unit of the digital control module 418 senses the amount of the offset voltage present in the input received by the preamp opamp 504 and provides corresponding digital signals to the servo opamp 506 to nullify the same. The microphone is then connected and the calibrated microphone interface 402 is used for normal operation. During normal operation, the path of the AC signal generated by the microphone gets separated from the path of the DC bias signal due to implementation of the DC servo loop 408 as discussed earlier. Further, as all noise signal paths are made differential, the noise signals get effectively rejected at the differential preamplifier 406.

Thus, the operation of the microphone assembly 400 and the associated digital control module 418 results in generation of high-quality audio reproduction. The microphone interface 402 of the microphone assembly 400 couples a microphone 404 with the preamplifier 406 for providing a distortion-free audio while at the same time using reduced number of components.

CONCLUSION

Although embodiments for microphone assembly and the microphone interface have been described in language specific to structural features and/or methods, it is to be understood that the appended claims are not necessarily limited to the specific features or methods described. Rather, the specific features and methods are disclosed as exemplary implementations for the microphone assembly and the microphone interface.

We claim:

1. A device comprising:
a microphone interface configured to directly couple a microphone, wherein the microphone interface comprises:
a DC servo loop configured to provide a DC path for a DC bias current supplied to the microphone; and
an AC ground to provide an AC path for an AC output of the microphone, wherein the AC path is separated from the DC path;
wherein the DC servo loop comprises:
a controlled DC source directly supplying the DC bias current to the microphone; and
a servo amplifier having at least one input coupled to the microphone, and an output coupled to the controlled DC source, and operative to control the DC bias current output by the controlled DC source and supplied directly to the microphone, wherein the servo amplifier is adapted to sense the DC bias current required to bias the microphone.

2. The device as claimed in claim 1, wherein the servo amplifier is configured to maintain a DC potential at both inputs of a preamplifier substantially equal to a potential due to the DC bias current provided to the microphone.

3. The device as claimed in claim 1, wherein the AC path couples the AC output of the microphone to an input of a preamplifier.

4. The device as claimed in claim 1, wherein the device further comprises a digital control module coupled to the microphone interface, the digital control module being configured to eliminate a DC offset in the microphone interface.

5. The device as claimed in claim 4, wherein the DC servo loop further comprises a slew boost module, wherein the slew boost module is operable by the digital control module.

6. An integrated circuit comprising:
a preamp opamp; and
a DC servo loop configured to provide capacitor-less coupling of a microphone to the preamp opamp, the DC servo loop comprising:
a servo opamp coupled to the preamp opamp; and
a servo transistor connected to the servo opamp, wherein the servo opamp controls the servo transistor to vary a DC bias current supplied to the microphone;
the integrated circuit further comprising a micbias opamp configured to provide an AC path for an AC output of the microphone, wherein the AC path is separated from a path of the DC bias current supplied to the microphone, and hence no DC-blocking capacitor is interposed between the microphone and the preamp opamp.

7. The integrated circuit as claimed in claim 6, further comprising:
a first pin interface to couple the microphone to the preamp opamp; and
a second pin interface to connect a bandwidth limiting capacitor to the servo transistor.

8. The integrated circuit as claimed in claim 6, wherein the DC servo loop further comprises a bandwidth limiting capacitor to provide a high impedance to audio frequency inputs from the microphone.

9. The integrated circuit as claimed in claim 6, wherein the integrated circuit further comprises:
an internal mic pin to couple an internal microphone to the preamp opamp;
an external mic pin to couple an external microphone to the preamp opamp; and
a microphone switch to selectively engage one of the internal microphone and the external microphone to the preamp opamp.

10. The integrated circuit as claimed in claim 6, wherein the DC servo loop further comprises a slew boost opamp connected to the servo transistor in parallel to the servo opamp.

11. The integrated circuit as claimed in claim 6, wherein the integrated circuit further comprises an electromagnetic interference (EMI) receptor to capture EMI signals and provide the captured EMI signals to the preamp opamp.

12. The integrated circuit as claimed in claim 11, wherein the EMI receptor is an unbounded IC pin interface.

13. The integrated circuit as claimed in claim 6, further comprising an AC ground, wherein the AC ground is differentially connected to the preamp opamp, such that noise signals coupled to the preamp opamp from the AC ground are differential noise signals.

14. A device comprising:
a preamplifier;
a microphone interface to directly couple an AC output of at least one microphone to the preamplifier, the microphone interface comprising a DC servo loop; and
a digital control module operably coupled to the microphone interface, wherein the digital control module is configured to eliminate a DC offset coupled to the preamplifier from the microphone interface,
wherein the DC servo loop comprises:
a controlled DC source directly supplying the DC bias current to the microphone; and
a servo amplifier having at least one input coupled to the microphone, and an output coupled to the controlled DC source, and operative to control the DC bias current output by the controlled DC source and supplied directly to the microphone, wherein the servo amplifier is adapted to sense the DC bias current required to bias the microphone.

15. The device as claimed in claim 14, wherein the DC servo loop comprises:
a servo amplifier to determine a DC bias current required by the microphone;
a controlled DC source to provide the determined DC bias current to the microphone; and
a slew boost module connected in parallel to the servo amplifier, wherein the slew boost module is operable by the digital control module to reduce a DC settling time of the servo amplifier.

16. The device as claimed in claim 15, wherein the digital control module comprises a counter mechanism to govern a time duration of operation of the slew boost module and wherein the digital control module is configured to interrupt an output of the preamplifier during operation of the slew boost module.

17. The device as claimed in claim 15, wherein the digital control module comprises a calibration unit to determine the DC offset and provide the determined DC offset to the servo amplifier with a reverse polarity for elimination of the DC offset.

18. The device as claimed in claim 14, wherein the device is selected from a group consisting of a cellular phone, a cordless phone, a camcorder, an audio recording device, a hearing aid, a computing device and a laptop.

* * * * *